United States Patent [19]

Kokubu et al.

[11] Patent Number: 4,624,934

[45] Date of Patent: Nov. 25, 1986

[54] CERAMIC COMPOSITION FOR MULTILAYER PRINTED WIRING BOARD

[75] Inventors: Yoshinori Kokubu, Tokyo; Jiro Chiba, Yokohama, both of Japan

[73] Assignee: Asahi Glass Company Ltd., Tokyo, Japan

[21] Appl. No.: 729,066

[22] Filed: Apr. 30, 1985

[30] Foreign Application Priority Data

May 4, 1984 [JP] Japan .................................. 59-88459

[51] Int. Cl.$^4$ .......................... C03C 8/20; C03C 8/16; C03C 14/00; C03C 3/066
[52] U.S. Cl. ...................................... 501/17; 501/18; 501/26; 501/32; 501/67; 501/79
[58] Field of Search ................. 501/32, 26, 17, 18, 501/67, 79, 61

[56] References Cited

U.S. PATENT DOCUMENTS

| | | | |
|---|---|---|---|
| 3,673,092 | 6/1972 | Dietz | 501/32 |
| 3,775,164 | 11/1973 | Smith et al. | 501/32 |
| 4,039,338 | 8/1977 | Swiss et al. | 501/153 |
| 4,153,491 | 5/1979 | Swiss et al. | 264/63 |
| 4,547,625 | 10/1985 | Tosaki et al. | 501/61 |

FOREIGN PATENT DOCUMENTS

| | | | |
|---|---|---|---|
| 56-5348 | 1/1981 | Japan | 501/32 |
| 59-46701 | 3/1984 | Japan | 501/32 |

*Primary Examiner*—Mark L. Bell
*Attorney, Agent, or Firm*—Oblon, Fisher, Spivak, McClelland, & Maier

[57] ABSTRACT

A ceramic composition for a multilayer printed wiring board, consisting essentially of from 35 to 95% by weight of glass powder and from 5 to 65% by weight of refractory filler powder, said refractory filler powder being at least one member selected from the group consisting of α-quartz, corundum, zircon and zirconia and said glass powder consisting essentially of from 25 to 40% by weight of $SiO_2$, from 4 to 15% by weight of $Al_2O_3$, from 15 to 25% by weight of $B_2O_3$, from 15 to 40% by weight of $BaO+CaO+MgO$, from 1 to 10% by weight of ZnO and from 0.5 to 5% by weight of $ZrO_2$.

7 Claims, No Drawings

CERAMIC COMPOSITION FOR MULTILAYER PRINTED WIRING BOARD

BACKGROUND OF THE INVENTION

1. Field of the Invention

The present invention relates to a ceramic composition for a multilayer printed wiring board. More particularly, it relates to a composition which can be sintered at a low temperature of not higher than 1000° C.

2. Description of the Prior Art

Electronic parts have been proposed wherein circuits and insulating layers are alternatively laminated on a insulating board to form three dimensional circuits. As such electronic parts, there are a first type which can be prepared by printing circuits and insulating layers alternatively on a board such as an alumina board previously formed by sintering, and then sintering the printed board, and a second type which can be prepared by printing circuits on non-sintered ceramic boards, and laminating the printed boards so that the circuits do not contact one another, followed by pressing and sintering.

In the first type, each insulating layer formed on a printed circuit becomes uneven due to the presence of the circuit therebeneath, and the unevenness increases towards upper layers. As the unevenness of the layer increases, it becomes difficult to print the next circuit thereon. This constitutes one of the factors which limit the number of laminated layers. Normally, in the first type, from 5 to 6 layers are regarded to be the maximum number.

Whereas, in the second type, the printing of a circuit is effected always to a substantially flat board, whereby there is no such limitation as in the case of the first type, and it is possible to prepare a product having a great number of laminated layers. Thus, it is possible to attain correspondingly high density integration.

As a material for the board of the second type, a composition comprising from 8 to 16% by weight of alumina powder and glass powder is disclosed in U.S. Pat. Nos. 4,039,338 and 4,153,491.

However, such a conventional composition has an extremely high sintering temperature at a level of from 1500° to 1600° C. Therefore, there have been difficulties such that it is required to use an expensive material such as W or Mo which is durable at such a high sintering temperature, as the material for the circuit, and it is required to conduct the sintering in a reducing atmosphere.

SUMMARY OF THE INVENTION

It is a primary object of the present invention to provide a ceramic composition which can be sintered at a temperature of from 850° to 1000° C. and which provides a sintered board having various properties required for a multilayer printed wiring board, such as high flexural strength, good thermal conductivity, low dielectric constant and great insulation resistance.

The present inventors have found that the above object can be attained by a composition prepared by incorporating a certain specific refractory powder to a glass powder of $SiO_2$-$Al_2O_3$-$B_2O_3$-ZnO-$ZrO_2$ type.

Namely, the composition of the present invention consists essentially of from 35 to 95% by weight of glass powder and from 5 to 65% by weight of refractory filler powder. The refractory filler powder is at least one member selected from the group consisting of α-quartz, corundum, zircon and zirconia. Whereas, the glass powder consists essentially of from 25 to 40% by weight of $SiO_2$, from 4 to 15% by weight of $Al_2O_3$, from 15 to 25% by weight of $B_2O_3$, from 15 to 40% by weight of BaO+CaO+MgO, from 1 to 10% by weight of ZnO and from 0.5 to 5% by weight of $ZrO_2$.

DETAILED DESCRIPTION OF THE INVENTION

The specific ranges of the respective components of the ceramic composition of the present invention have the following significance.

If the glass powder is less than 35% by weight, the sintering temperature tends to be high, whereby it becomes difficult to conduct the sintering at a low temperature as intended by the present invention. On the other hand, if the glass powder exceeds 95% by weight, the flexural strength and corrosion resistance to water of the sintered product tends to be poor. The glass powder is preferably within a range of from 40 to 90% by weight within the above specified range.

As the refractory filler, α-quartz, corundum, zircon and zirconia are used alone or in various combinations. If other fillers are used, it is difficult to obtain the properties required for the printed wiring board. Namely, there will be difficulties such that the mechanical strength is inadequate for the practical use, or the thermal conductivity is so small that, when a circuit element is provided thereon, the heat dissipation will be inadequate for the practical application.

As the zirconia among the above fillers, so-called stabilized zirconia obtained by incorporating a small amount (about 5% by weight) of a cubic system oxide such as CaO, MgO or $Y_2O_3$, followed by sintering, is preferred.

As the glass powder for the present invention, a powder having the following composition is preferred in that it has a low dielectric constant and is capable of forming, together with the refractory filler powder, a sintered product having excellent flexural strength and corrosion resistance to water.

| | |
|---|---|
| $SiO_2$ | 25–40% by weight |
| $Al_2O_3$ | 4–15% by weight |
| $B_2O_3$ | 15–25% by weight |
| BaO + CaO + MgO | 15–40% by weight |
| ZnO | 1–10% by weight |
| $ZrO_2$ | 0.5–5% by weight |

The specific ranges of the respective components have the following significance.

If $SiO_2$ is less than 25% by weight, the softening point tends to be low and a substantial deformation is likely to take place during the sintering. On the other hand, if $SiO_2$ exceeds 40% by weight, the sintering temperature tends to be too high. The amount of $SiO_2$ is preferably within a range of from 28 to 36% by weight.

If $Al_2O_3$ is less than 4% by weight, the corrosion resistance to water of the sintered product tends to be poor. On the other hand, if $Al_2O_3$ exceeds 15% by weight, the softening point tends to be high, and the sintering temperature tends to be too high. The amount of $Al_2O_3$ is preferably within a range of from 5 to 14% by weight.

$B_2O_3$ is a flux. If the amount is less than 15% by weight, the sintering temperature tends to be too high, and if the amount exceeds 25% by weight, the chemical stability of the glass tends to be poor. The amount is preferably within a range of from 16 to 24% by weight.

BaO, CaO and MgO are added to improve the melting property for the preparation of the glass powder and to adjust the thermal expansion coefficient of the glass. If the total amount is less than 15% by weight, no adequate improvement of the melting property can be attained, and devitrification is likely to occur during the preparation of the glass powder, and if the amount exceeds 40% by weight, the thermal expansion coefficient tends to be too great. The amount is preferably within a range of from 16 to 39% by weight.

With respect to ZnO, it is desirable to incorporate it in an amount of at least 1% by weight in order to improve the melting property of the glass. However, if the amount exceeds 10% by weight, the softening point of the glass tends to be too low, and a substantial deformation is likely to take place during the sintering, such being undesirable. The preferred range is from 2 to 9% by weight.

It is desirable to incorporate $ZrO_2$ in an amount of at least 0.5% by weight in order to improve the chemical stability of the glass. However, if the amount exceeds 5% by weight, the melting property for the preparation of the glass powder tends to be inferior. The preferred range is from 1 to 4% by weight.

The glass powder of the present invention is preferably constituted in at least 95% of its entirety by the above-mentioned components. For the rest of less than 5%, it is possible to incorporate a coloring agent, $SnO_2$ to improve the water resistance or PbO, etc. to improve the melting property.

In the present invention, with respect to the particle size of each of the respective powders such as the glass powder, the average particle size is preferably from 0.5 to 5 μm, and the maximum particle size is preferably 20 μm. If the particle size of the powder is too small, cracks are likely to form during the drying step of the green sheet. On the other hand, if the particle size is too large, the filler will not adequately be wetted with the glass, whereby the strength of the board tends to be low.

The composition of the present invention may be prepared, for instance, in the following manner.

Starting materials for the respective components, such as silica, alumina, boric acid, barium carbonate, calcium carbonate, magnesia, zinc oxide, zirconia and the like, are blended and mixed to obtain a batch having a desired composition for the glass powder. Then, this batch is placed in a platinum crucible, and heated in an electric furnace at a temperature of from 1400° to 1500° C. for about 2 hours for vitrification. Then, the molten glass is poured into water for crushing, or it is formed into a sheet and then crushed in a ball mill, to obtain a glass powder.

Then, this glass powder and the above-mentioned refractory filler powder are mixed in the predetermined proportions to obtain a composition of the present invention. The mixing of the glass powder with the filler may be conducted by adding a predetermined amount of the filler at the time of the pulverization of the glass in a ball mill, so that the pulverization and mixing can be simultaneously carried out.

The composition of the present invention is composed of the above-mentioned powders in the specified proportions. By using such a composition, a multilayer printed wiring board may be prepared, for instance, in the following manner.

To the composition of the present invention, an organic binder, a plasticizer and a solvent are added and kneaded to form a paste. As the organic binder, plasticizer and solvent, there may be employed those which are commonly used. For instance, as the organic binder, polyvinyl butyral may be used. As the plasticizer, there may be employed dioctyl phthalate or polyethylene glycol. As the solvent, there may be employed toluene or an alcohol.

Then, the paste is molded into a sheet, and further dried at a temperature of from 60° to 80° C. to obtain a green sheet. Then, a paste containing a powder of Pd, Ag or the like is printed in a predetermined pattern on one side of this green sheet to form a printed circuit. Such printed green sheets are then laminated, and pressed to form a unitary laminate. The laminate is then subjected to sintering, whereby the green sheets and circuits are sintered to each other. The product thereby obtained is a laminate wherein circuits are laminated in a plurality of layers with insulating sheets interposed inbetween.

Now, the present invention will be described in further detail with reference to Examples. However, it should be understood that the present invention is by no means restricted to these specific Examples.

EXAMPLES

Glasses of Examples 1 to 20 having compositions as identified in the upper part of Table 1 were prepared and pulverized as mentioned above, and at the time of their pulverization, they were mixed with fillers of the types and amounts as identified in the lower part of the same Table to obtain compositions. In each composition, the content of the glass powder is the rest of the amounts of fillers. Examples 17 to 20 represent Comparative Examples.

Then, to each composition, polyvinyl butyral as an organic binder, dioctyl phthalate and polyethylene glycol as plasticizers and toluene and alcohol as solvents, were added, and the mixture was kneaded to obtain a paste having a viscosity of from 10000 to 30000 cps. Then, this paste was formed into a sheet having a thickness of about 0.5 mm, and then dried at a temperature of from 60° to 80° C. for about 2 hours. Then, this sheet was heated at a rate of 300° C./hr, and finally sintered for 1 hour at the heating temperature as specified in Table 2 to obtain a sintered sheet. With respect to this sintered sheet, the volume resistivity, the dielectric constant, the dielectric loss tangent, the thermal expansion coefficient, and the flexural strength were measured. The results are shown in Table 2.

The flexural strength was measured in the following manner.

The sintered sheet was cut into a size of 10 mm in width (w) and 50 mm in length. This sample was placed on two supports disposed with a distance L of 40 mm, and a load was exerted at the center portion between the two supports at a rate of 0.5 mm/min, whereby the load p upon the breakage of the sample was obtained.

From the above values, the flexural strength $\sigma$ was obtained according to the following equation.

$$\sigma = \frac{3pL}{2wt^2}$$

where $\sigma$ is the flexural strength, p is the load, L is the distance between the supports, w is the width of the test sample, and t is the thickness of the test sample.

electric characteristics such as dielectric constants, are adequately satisfactory for use for multilayer printed wiring boards.

TABLE 1

(Composition Examples)

| | Example No. | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17* | 18* | 19* | 20* |
| Composition of glass (wt. %) | | | | | | | | | | | | | | | | | | | | |
| $SiO_2$ | 38 | 32 | 29 | 29 | 29 | 26 | 26 | 36 | 29 | 28 | 28 | 28 | 29 | 29 | 34 | 34 | 50 | 50 | 28 | 28 |
| $Al_2O_3$ | 10 | 11 | 7 | 7 | 7 | 13 | 13 | 6 | 6 | 10 | 10 | 10 | 6 | 6 | 10 | 10 | 10 | 10 | 10 | 10 |
| $B_2O_3$ | 15 | 20 | 23 | 23 | 23 | 20 | 20 | 17 | 17 | 20 | 20 | 20 | 17 | 17 | 20 | 20 | 10 | 10 | 20 | 20 |
| BaO | 25 | 25 | 25 | 25 | 25 | 25 | 25 | 10 | 35 | | | | 35 | 35 | 7 | 7 | 20 | 20 | | |
| CaO | 4 | 4 | 4 | 4 | 4 | 4 | 4 | 10 | 2 | 34 | | | 2 | 2 | 7 | 7 | | | | |
| MgO | 4 | 4 | 4 | 4 | 4 | 4 | 4 | 6 | 1 | | 34 | 34 | 1 | 1 | 7 | 7 | | | 34 | 34 |
| ZnO | 5 | 5 | 8 | 8 | 8 | 2 | 2 | 8 | 3 | 5 | 3 | 3 | 3 | 3 | 8 | 8 | 10 | 10 | 3 | 3 |
| $ZrO_2$ | 2 | 4 | 3 | 3 | 3 | 4 | 4 | 3 | 3 | 3 | 3 | 3 | 3 | 3 | 3 | 3 | 0 | | | 3 |
| $SnO_2$ | | | | | | | | | | 4 | | | 2 | 2 | | | 4 | 4 | 2 | 2 |
| PbO | | | | | | | | 4 | | | | 4 | | | | | | | 3 | 3 |
| Refractory fillers (wt. %) | | | | | | | | | | | | | | | | | | | | |
| α-Quartz | | | 30 | | | | | | | | | 60 | 10 | | 10 | 3 | | | | |
| Corundum | 20 | 25 | | 20 | | 10 | | | | | | 60 | | | 10 | 3 | | | | |
| Zircon | 20 | 10 | | | | | | 10 | 60 | | | | | 10 | 10 | 3 | 20 | | | |
| Stabilized zirconia | | | | 50 | 15 | 10 | | | 60 | | | | | | 10 | 3 | | | 20 | 20 |
| β-Alumina | | | | | | | | | | | | | | | | | | 20 | | |

*Comparative Examples

TABLE 2

| | Example No. | | | | | | | | | |
|---|---|---|---|---|---|---|---|---|---|---|
| | 1 | 2 | 3 | 4 | 5 | 6 | 7 | 8 | 9 | 10 |
| Softening point (°C.) | 800 | 790 | 810 | 805 | 805 | 800 | 800 | 825 | 805 | 815 |
| Transformation point (°C.) | 640 | 620 | 610 | 610 | 610 | 610 | 610 | 640 | 620 | 630 |
| Thermal expansion coefficient ($\times 10^{-7}$ °C.$^{-1}$) | 55 | 57 | 60 | 68 | 60 | 57 | 55 | 63 | 53 | 51 |
| Flexural strength (kg/mm$^2$) | 22 | 20 | 20 | 25 | 22 | 20 | 20 | 25 | 21 | 24 |
| Resistivity ($\Omega \cdot$ cm) | $10^{15}$ | $10^{15}$ | $10^{14}$ | $10^{15}$ | $10^{15}$ | $10^{14}$ | $10^{15}$ | $10^{15}$ | $10^{14}$ | $10^{14}$ |
| Dielectric constant | 7.2 | 7.5 | 6.7 | 7.3 | 7.2 | 7.3 | 7.1 | 7.5 | 7.3 | 7.3 |
| Dielectric loss | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $8 \times 10^{-4}$ | $1 \times 10^{-3}$ | $1 \times 10^{-3}$ | $1 \times 10^{-3}$ |

| | Example No. | | | | | | | | | |
|---|---|---|---|---|---|---|---|---|---|---|
| | 11 | 12 | 13 | 14 | 15 | 16 | 17* | 18* | 19* | 20* |
| Softening point (°C.) | 810 | 850 | 820 | 815 | 810 | 800 | 900 | 920 | 880 | 900 |
| Transformation point (°C.) | 610 | 610 | 610 | 620 | 630 | 630 | 660 | 660 | 650 | 650 |
| Thermal expansion coefficient ($\times 10^{-7}$ °C.$^{-1}$) | 60 | 69 | 57 | 54 | 60 | 58 | 50 | 67 | 85 | 82 |
| Flexural strength (kg/mm$^2$) | 25 | 23 | 20 | 20 | 24 | 22 | 12 | 10 | 9 | 10 |
| Resistivity ($\Omega \cdot$ cm) | $10^{15}$ | $10^{14}$ | $10^{14}$ | $10^{14}$ | $10^{15}$ | $10^{15}$ | $10^{14}$ | $10^{10}$ | $10^{12}$ | $10^{12}$ |
| Dielectric constant | 7.8 | 6.6 | 6.9 | 7.1 | 7.2 | 7.1 | 7.5 | 7.7 | 8.5 | 8.3 |
| Dielectric loss | $1 \times 10^{-3}$ | $7 \times 10^{-4}$ | $1 \times 10^{-3}$ | $1 \times 10^{-3}$ | $1 \times 10^{-3}$ | $1 \times 10^{-3}$ | $3 \times 10^{-3}$ | $2 \times 10^{-2}$ | $2 \times 10^{-3}$ | $2 \times 10^{-3}$ |

The flexural strength shown in the Table is an average value obtained from ten samples.

The same Table contains data on the transformation point and the softening point of the glass, which were measured in the following manners.

One gram of the glass powder was put into a holder of a differential thermal analyser, and the temperature was raised from room temperature at a rate of 10° C./min., whereupon a thermogram was drawn. In this thermogram, the initial endothermic point was taken as the transformation point and the second endothermic point was taken as the softening point.

It is evident from the Table that the compositions of the present invention can be sintered at a low temperature of not higher than 1000°0 C., and the sintered products have excellent flexural strength. Further, their

What is claimed is:

1. A ceramic composition for a multilayer printed wiring board, consisting essentially of:
   (A) from 35-95% by weight of a glass powder consisting essentially of from 25-40% by weight $SiO_2$, from 4-15% by weight $Al_2O_3$, from 15-25% by weight $B_2O_3$, from 15-40% by weight of BaO+CaO+MgO, from 1-10% by weight ZnO and from 0.5-5% by weight $ZrO_2$; and
   (B) from 5-65% by weight of a refractory filler powder being a material selected from the group consisting of alpha-quartz, corundum, zircon, stabilized zirconia and zirconia.

2. The composition of claim 1, wherein said glass powder component (A) is present in an amount of from 40–90% by weight.

3. The composition of claim 2, wherein said glass powder component (A) consists essentially of from 28–36% by weight $SiO_2$, from 5–14% by weight $Al_2O_3$, from 16–24% by weight $B_2O_3$, from 16–39% by weight $BaO+CaO+MgO$, from 2–9% by weight of ZnO and from 1–4% by weight $ZrO_2$.

4. The composition of claim 1, wherein said refractory filler powder (B) is stabilized zirconia.

5. The composition of claim 2, wherein said refractory filler powder (B) is stabilized zirconia.

6. The composition of claim 1, wherein said glass powder component (A) additionally comprises a minor amount less than 5% of a coloring agent, $SnO_2$ to improve the water resistance properties of the composition and PbO to improve the melting properties of the composition.

7. The composition of claim 1, wherein the average particle size of both the glass powder component (A) and the refractory filler powder (B) ranges from 0.5–5 µm, and the maximum particle size of particles present in each component is 20 µm.

* * * * *